(12) United States Patent
Willett

(10) Patent No.: US 12,336,438 B2
(45) Date of Patent: Jun. 17, 2025

(54) OPTICALLY TRANSPARENT SURFACE GATE FOR A QUBIT MEMORY CELL

(71) Applicant: Nokia Technologies Oy, Espoo (FI)

(72) Inventor: Robert Willett, Warren, NJ (US)

(73) Assignee: Nokia Technologies Oy, Espoo (FI)

( * ) Notice: Subject to any disclaimer, the term of this patent is extended or adjusted under 35 U.S.C. 154(b) by 686 days.

(21) Appl. No.: 17/582,800

(22) Filed: Jan. 24, 2022

(65) Prior Publication Data
US 2023/0240155 A1    Jul. 27, 2023

(51) Int. Cl.
| H01L 23/535 | (2006.01) |
| G06N 10/40  | (2022.01) |
| G06N 10/60  | (2022.01) |
| G11C 11/44  | (2006.01) |
| H10N 60/10  | (2023.01) |

(52) U.S. Cl.
CPC ........... *H10N 60/128* (2023.02); *G06N 10/40* (2022.01); *G06N 10/60* (2022.01); *G11C 11/44* (2013.01); *H10N 60/11* (2023.02)

(58) Field of Classification Search
CPC ...... H10N 60/128; H10N 60/11; G06N 10/40; G06N 10/60; G11C 11/44
See application file for complete search history.

(56) References Cited

U.S. PATENT DOCUMENTS

| 7,960,714 | B2 | 6/2011  | Baldwin et al. |
| 8,324,120 | B2 | 12/2012 | Baldwin et al. |
| 8,362,461 | B2 | 1/2013  | Baldwin et al. |
| 8,633,092 | B2 | 1/2014  | Baldwin et al. |
| 8,987,703 | B2 | 3/2015  | Willett        |
| 9,748,473 | B2 | 8/2017  | Willett        |
| 10,262,871 | B1 | 4/2019 | Nayfeh et al.  |

(Continued)

FOREIGN PATENT DOCUMENTS

WO     2020180956 A1     9/2020

OTHER PUBLICATIONS

Bruzewicz, Colin D., et al. "Trapped-Ion Quantum Computing: Progress and Challenges." arXiv preprint, arxiv.org, arXiv:1904.04178v1 (Apr. 8, 2019): 1-56.

(Continued)

*Primary Examiner* — Samuel Park
(74) *Attorney, Agent, or Firm* — Mendelsohn Dunleavy, P.C.; Steve Mendelsohn

(57) ABSTRACT

A qubit memory cell having a thin, optically transparent, metal surface gate that laterally fits into the corresponding region of the memory cell, while not being in direct contact with the perimeter of the region. The surface gate may have apertures to accommodate therein the dot-like control electrodes of the qubit and enable the corresponding electrical overpass bridges to be connected to those dot-like control electrodes. The thickness of the surface gate may be selected such as to let a substantial portion of light impinging thereupon penetrate to the underlying surface of the substrate. In at least some embodiments, the electrical-interconnect structure of the memory cell may be designed to enable separate electrical biasing of the surface gate, e.g., independent of the electrical biasing of some other electrodes of the memory cell. Advantageously, such a surface gate may significantly reduce detrimental clumping of charge carriers in the memory cell.

15 Claims, 7 Drawing Sheets

(56) References Cited

U.S. PATENT DOCUMENTS

| | | | |
|---|---|---|---|
| 10,956,267 | B2 | 3/2021 | Kapit |
| 11,171,211 | B1 * | 11/2021 | Park ................. H01L 29/78681 |
| 2010/0155697 | A1 | 6/2010 | Baldwin et al. |
| 2015/0155478 | A1 | 6/2015 | Willett |
| 2020/0098990 | A1 | 3/2020 | Nayfeh |
| 2020/0135254 | A1 * | 4/2020 | Willett ................. H01L 29/151 |
| 2020/0364598 | A1 | 11/2020 | Ashikhmin |
| 2021/0247917 | A1 | 8/2021 | Willett |
| 2022/0122877 | A1 * | 4/2022 | Or-Bach ................ H10B 41/20 |

OTHER PUBLICATIONS

Nayak, Chetan, et al. "Non-Abelian Anyons and Topological Quantum Computation." arXiv preprint, arxiv.org, arXiv:0707.1889v2 (Mar. 28, 2008): 1-73.

Nickerson, Naomi H., et al. "Topological quantum computing with a very noisy network and local error rates approaching one percent." Nature Communications 4.1756 (2013): 1-12.

\* cited by examiner

OPTICALLY TRANSPARENT SURFACE GATE FOR A QUBIT MEMORY CELL

BACKGROUND

Field

Various example embodiments relate to quantum computing and, more specifically but not exclusively, to a memory system for a quantum-computing device.

Description of the Related Art

This section introduces aspects that may help facilitate a better understanding of the disclosure. Accordingly, the statements of this section are to be read in this light and are not to be understood as admissions about what is in the prior art or what is not in the prior art.

Quantum-computing devices have been made or proposed based on various technologies, e.g., superconducting-junction devices, ion-trap devices, and fractional-quantum-Hall-effect (FQHE) devices. Quantum-computing devices typically use a memory to store a state and hardware for writing the state to the memory and for reading the state from the memory. Reliable methods for writing to the memory and reading from the memory are useful for various types of quantum-computing devices.

For example, certain FQHE states have been suggested as possibly being useful for quantum-computing devices. For some such states, interferometric devices have been suggested for defining the FQHE state, changing said state, and doing computation with said states. That is, an interferometric device can be used to write and read a quantum bit (often referred to as a qubit) and to enable interactions so that different qubits can be manipulated for quantum computation, e.g., in a quantum gate.

SUMMARY OF SOME SPECIFIC EMBODIMENTS

Disclosed herein are various embodiments of a qubit memory cell having a thin, substantially optically transparent, metal surface gate that laterally fits into the corresponding region of the memory cell, while not being in direct contact with the perimeter of the region. The surface gate may have apertures to accommodate therein the dot-like control electrodes of the qubit and enable the corresponding electrical overpass bridges to be connected to those dot-like control electrodes. The thickness of the surface gate may be selected such as to let a substantial portion of light impinging thereupon penetrate to the underlying surface of the semiconductor substrate. In at least some embodiments, the electrical-interconnect structure of the memory cell may be designed to enable separate electrical biasing of the surface gate, e.g., independent of the electrical biasing of some other electrodes of the memory cell. Advantageously, such a surface gate may significantly reduce detrimental clumping of charge carriers in the memory cell and may further be used to at least partially control the overall density of the charge carriers within the qubit, e.g., through application to the surface gate of an individually controlled, separate electrical bias.

According to an example embodiment, provided is an apparatus, comprising: a semiconductor substrate having a quantum-well structure along a surface thereof; one or more memory cells on the substrate, each of the memory cells having a pattern of controllable electrodes on the surface of the substrate, the electrodes laterally defining a physical sequence of two or more lateral regions of the quantum-well structure joined by one or more channels; and one or more metal surface gates on the surface of the substrate within the two or more lateral regions, the one or more metal surface gates having a thickness that enables a substantial portion of light impinging thereupon to penetrate therethrough to the surface of the substrate; and wherein the electrodes are controllable to deplete lateral areas of the quantum-well structure of charge carriers such that a droplet of the charge carriers in the quantum-well structure is localized laterally along the surface of the substrate beneath the one or more metal surface gates.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Some embodiments may benefit from at least some features disclosed in U.S. Pat. Nos. 8,324,120, 8,633,092, 8,987,703, and 9,748,473, in U.S. Patent Application Publication Nos. 2020/0135254 and 2021/0247917, and in the article by Chetan Nayak, Steven H. Simon, Ady Stern, et al., "Non-Abelian Anyons and Topological Quantum Computation," Rev. Mod. Phys., 2008, v. 80, pp. 1083-1155, all of which are incorporated herein by reference in their entirety.

Herein, various memories for storing, reading, and manipulating qubits are based on a laterally confined droplet of a 2-dimensional (2D) charge-carrier gas (2DCCG), e.g., an electron or hole gas located in a quantum-well, which is maintained in a special FQHE state. Typically, the gas of charge carriers of the FQHE state is maintained to have a fixed filling factor, e.g., 5/2, 7/2, 3/5, 12/5, or 17/5 of Landau levels for the laterally confined droplet of the 2D gas of charge carriers in a transverse magnetic field. The FQHE state is produced by subjecting the 2DCCG to a perpendicular magnetic field at a suitably low temperature, e.g., below 150 mK. The corresponding cooling system may include, e.g., a He-based dilution refrigerator. The magnetic-field strength can be about 5 Tesla or more, which can be generated in a conventional manner, e.g., using a superconducting magnet. At least some of the above-indicated FQHE states can be used for computations.

Below, FIGS. 1-4 illustrate examples of memory cells for storing, manipulating, and reading qubits.

Figure 1:
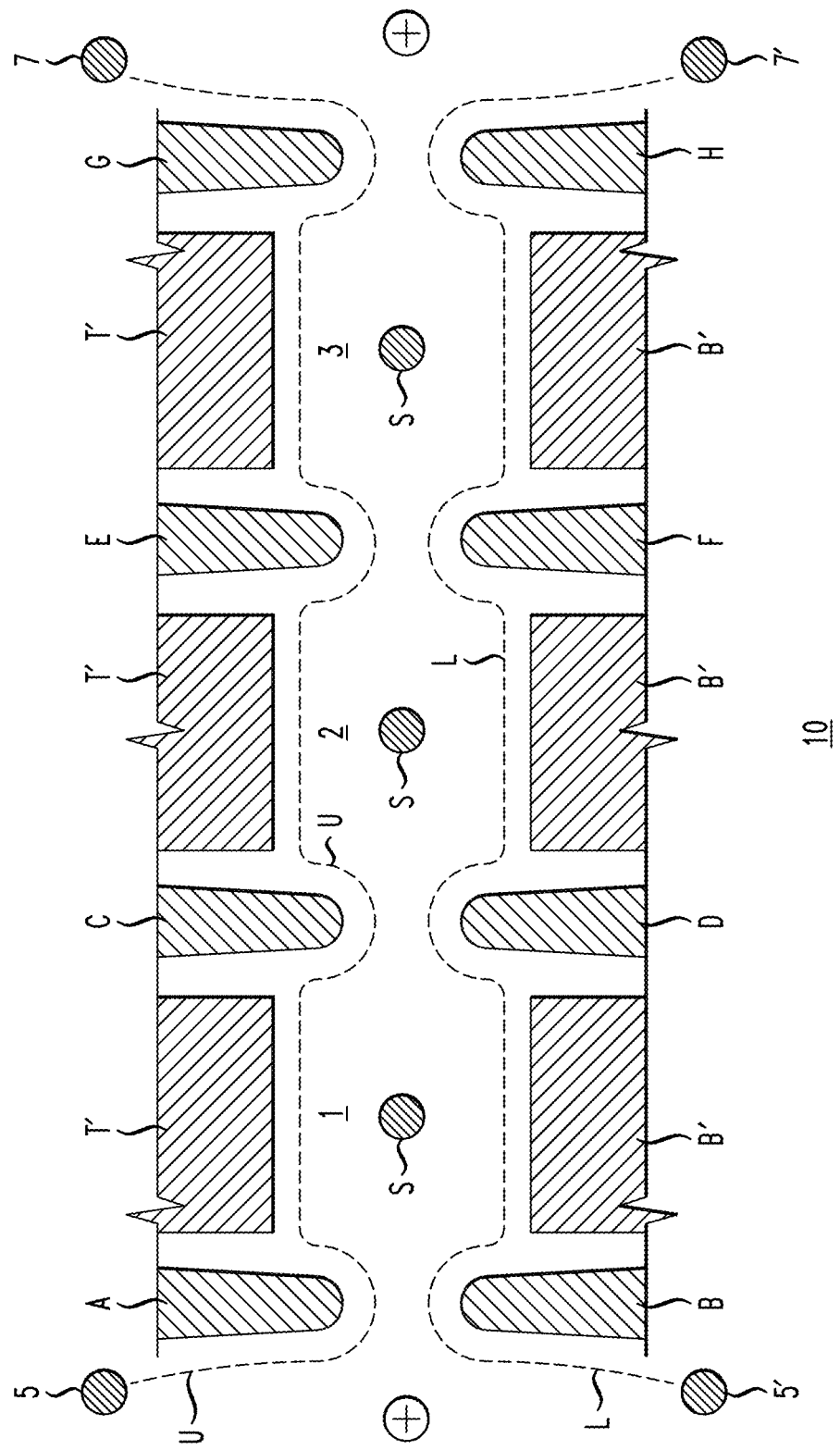
FIG. 1 shows a schematic top view of a portion of a memory cell that can be used in a quantum-computing device according to an embodiment.

FIG. 1 shows a schematic top view of a portion of a memory cell 10 for a single qubit based on the FQHE that can be used in a quantum-computing device according to an embodiment. The memory cell 10 includes an electrode pattern (indicated in FIG. 1 by the hatched areas) on and/or over a top surface of a planar, semiconductor quantum-well structure. The top surface typically extends perpendicular to the stacking direction of the semiconductor layers in the planar, semiconductor quantum-well structure. Portions of the electrode pattern may be on the surface, and other portions of the electrode pattern may be near and above said surface, but are, for simplicity, shown in FIG. 1 as being on the top surface. Some of the constituent layers (see, e.g., 610, FIG. 6) of memory cell 10 are not explicitly shown in FIG. 1 for better clarity of depiction.

The planar, semiconductor quantum-well structure is configured to vertically trap a 2DCCG gas, e.g., an electron gas. For example, the planar, semiconductor quantum-well structure may have a 2D gallium arsenide (GaAs) well region vertically surrounded by aluminum gallium arsenide (AlGaAs) barrier layers and may have other layers carrying dopants to provide the charge carriers for the well region. The planar, semiconductor quantum-well structure may also have a more-complex multiple quantum-well structure to better screen defects related to charged dopant atoms, e.g., may include narrower screening quantum-wells surrounding the main quantum-well, and/or the planar, semiconductor quantum-well structure may be based on layers of different semiconductor alloys. In some embodiments, graphene-based memory cells may also be used.

The above-cited U.S. Pat. Nos. 8,324,120, 8,633,092, and 8,987,703 describe examples of planar, semiconductor quantum-well structures that may be used in at least some embodiments.

In memory cell 10, the electrode pattern is formed by a pattern of metal gates, which can be voltage biased to deplete areas below the electrode pattern of the 2DCCG gas and thereby provide lateral confinement of a 2D droplet of the 2DCCG gas between said electrodes. The lateral edges of the 2D droplet, which are labeled in FIG. 1 as U and L, respectively, are shown by dashed lines. In memory cell 10, metal gates substantially laterally surround three separate lateral regions 1, 2, 3, which are used for storing and manipulating a single qubit.

In another embodiment, additional metal gates can be used to substantially laterally surround more than three separate lateral regions analogous to the lateral regions 1, 2, 3. An example of such an embodiment is described in more detail below in reference to FIG. 2.

In the embodiment shown in FIG. 1, the pattern of metal gates includes first electrodes T', second electrodes B', and channel electrodes A, B, C, D, E, F, G, and H.

In each of the three regions 1, 2, 3, the voltage biasing of the first and second electrodes T', B' and the channel electrodes A-H can be used to deplete the underlying and adjacent regions of charge carriers of the 2D gas, thereby substantially defining the lateral extent of the droplet of the 2DCCG gas along the top surface of the planar, semiconductor quantum-well structure. Indeed, the biasing of said electrodes T', B' can often be changed to move the upper and lower edges U, L of said droplet of the 2DCCG gas. The horizontal boundaries of the lateral regions 1, 2, 3 are defined by the biasing of channel electrodes A-H, which have narrow channels between the facing pairs thereof. Notably, the voltage biasing of facing pairs (A, B), (C, D), (E, F), and (G, H) of said channel electrodes may be adjusted to narrow or widen one or more of the channels. Narrowing one of said channels enables edge excitations of the droplet of the 2DCCG gas to tunnel between the edges U and L of the laterally confined droplet at said channel when the droplet is maintained in a substantially incompressible FQHE state. Also, charge can thus be enabled to tunnel between the U and L edges of the droplet between facing pairs of the channel electrodes A-H.

In some embodiments, one or more small or dot-like electrodes (not explicitly shown in FIG. 1, e.g., see P, FIG. 3) may be located between each or some of the facing pairs of the channel electrodes, i.e., (A, B), (C, D), (E, F), and (G, H), to enable better control of tunneling of charge and/or edge excitations therebetween. Said small or dot-like electrodes may also be separately voltage biased.

Each region 1, 2, 3 also has, at least one, small electrode S, e.g., a dot-like or disk-shaped electrode at the interior thereof. Said small electrodes S may be slightly above the top surface of the corresponding planar, semiconductor quantum-well structure(s) and configured to capacitively couple to the corresponding 2D droplet. Said small electrodes S enable storage of specific excitations of appropriate FQHE states in the adjacent set of regions 1, 2, 3 through the application of appropriate voltage biasing.

The above-cited U.S. Pat. Nos. 8,324,120, 8,633,092, and 8,987,703 describe example patterns of electrodes that may be useful in some embodiments to cause a corresponding 2DCCG gas to be in an appropriate FQHE state and/or to cause excitations of a laterally confined droplet of the 2DCCG, e.g., for storing and reading qubit values.

Memory cell 10 may further include a left pair of measurement electrodes (5, 5') and a right pair of measurement electrodes (7, 7') that can be used to measure currents carried between the edges U, L of the droplet of the 2DCCG gas at the respective left and right sides of the memory cell. Said measurement electrodes 5, 5', 7, 7' may have various suitable shapes and locations.

In some other embodiments, a memory cell for a single qubit may include, at least, four separate regions for laterally confining a portion of the droplet of the 2DCCG gas along the top surface of the corresponding planar, semiconductor quantum-well structure. Each of the four or more separate regions typically includes respective first and second electrodes T', B' for controlling the edges U, L of the droplet by voltage biasing as already described above in reference to the regions 1, 2, 3 shown in FIG. 1. Each of the four or more separate regions has respective channels at opposite sides thereof, and each channel is controlled by a respective facing pair of channel electrodes, e.g., similar to the facing pairs (A, B), (C, D), (E, F), and (G, H) of FIG. 1. For the four or more regions, portions of the droplet of the 2DCCG gas, in adjacent ones of the regions, are connected by the channel between said adjacent regions. Also, each of the four or more regions may include, in the interior thereof, a respective small electrode, e.g., similar to electrodes S of FIG. 1, which may be biased or charged.

Example methods of operating qubit memory cell, such as memory cell 10, are described in the above-cited U.S. Patent Application Publication No. 2020/0135254. Based on the disclosure of the present application, a person of ordinary skill in the relevant arts will be able to adapt those methods for operating memory cells having four or more separate regions for laterally confining a portion of the droplet of the 2DCCG gas, without any undue experimentation.

Figure 2:
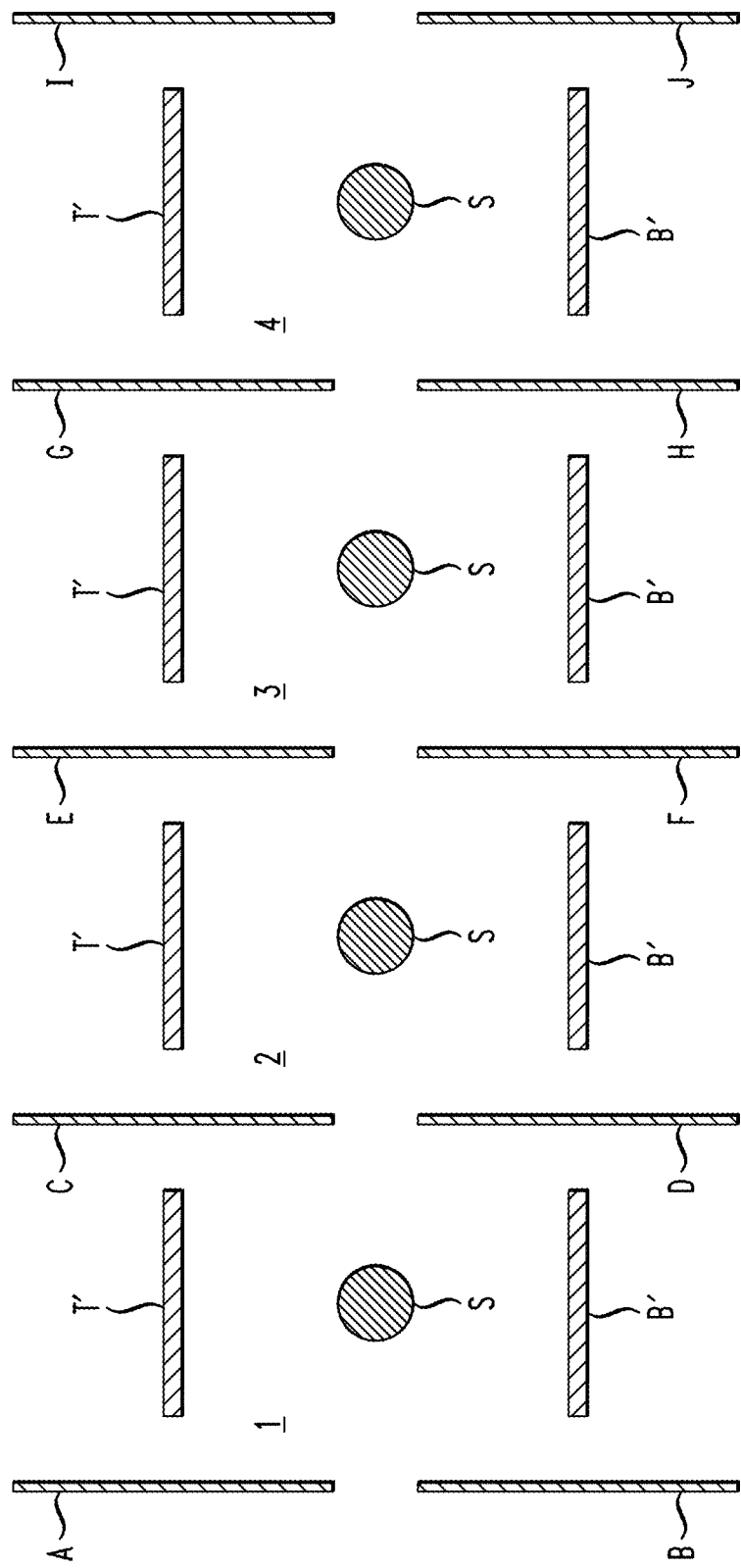
FIG. 2 shows a schematic diagram of a portion of a memory cell that can be used in a quantum-computing device according to another embodiment.

FIG. 2 shows a schematic diagram of a portion of a memory cell 200 for a single qubit based on the FQHE that can be used in a quantum-computing device according to another embodiment. More specifically, the schematic diagram of FIG. 2 graphically represents a simplified top view of memory cell 200 that is analogous to the top view shown in FIG. 1.

Memory cell 200 differs from memory cell 10 (FIG. 1) in that memory cell 200 includes four separate regions, labeled 1-4, respectively, for laterally confining portions of the droplet of the 2DCCG gas along the top surface of the corresponding planar, semiconductor quantum-well structure. Memory cell 200 can be constructed, e.g., by adding the lateral region 4 and the corresponding electrodes T', B', I, J, and S to the memory cell 10 (FIG. 1). Similar, to memory cell 10, memory cell 200 can be configured to support a single qubit.

For example, the regions 1 and 2 of memory cell 200 can be configured to support a first topological quantum state, e.g., |0>. The regions 3 and 4 of memory cell 200 can similarly be configured to support a second topological quantum state, e.g., |1>. The first and second topological quantum states can be entangled such that, together, the regions 1-4 can support a superposed quantum state, $|m> = \alpha|0> + \beta|1>$, wherein (i) the filling factor of 5/2 is continuous throughout the regions 1-4 and (ii) the charges can move coherently along the U and L edges of the droplet laterally confined within the regions 1-4 (also see FIG. 1).

To enable reads and writes of two quantum states, the memory cell 200 may typically include further regions for laterally confining the droplet of the 2DCCG gas directly to the left of region 1 and to the right of region 4 (not explicitly shown in FIG. 2).

Figure 3:
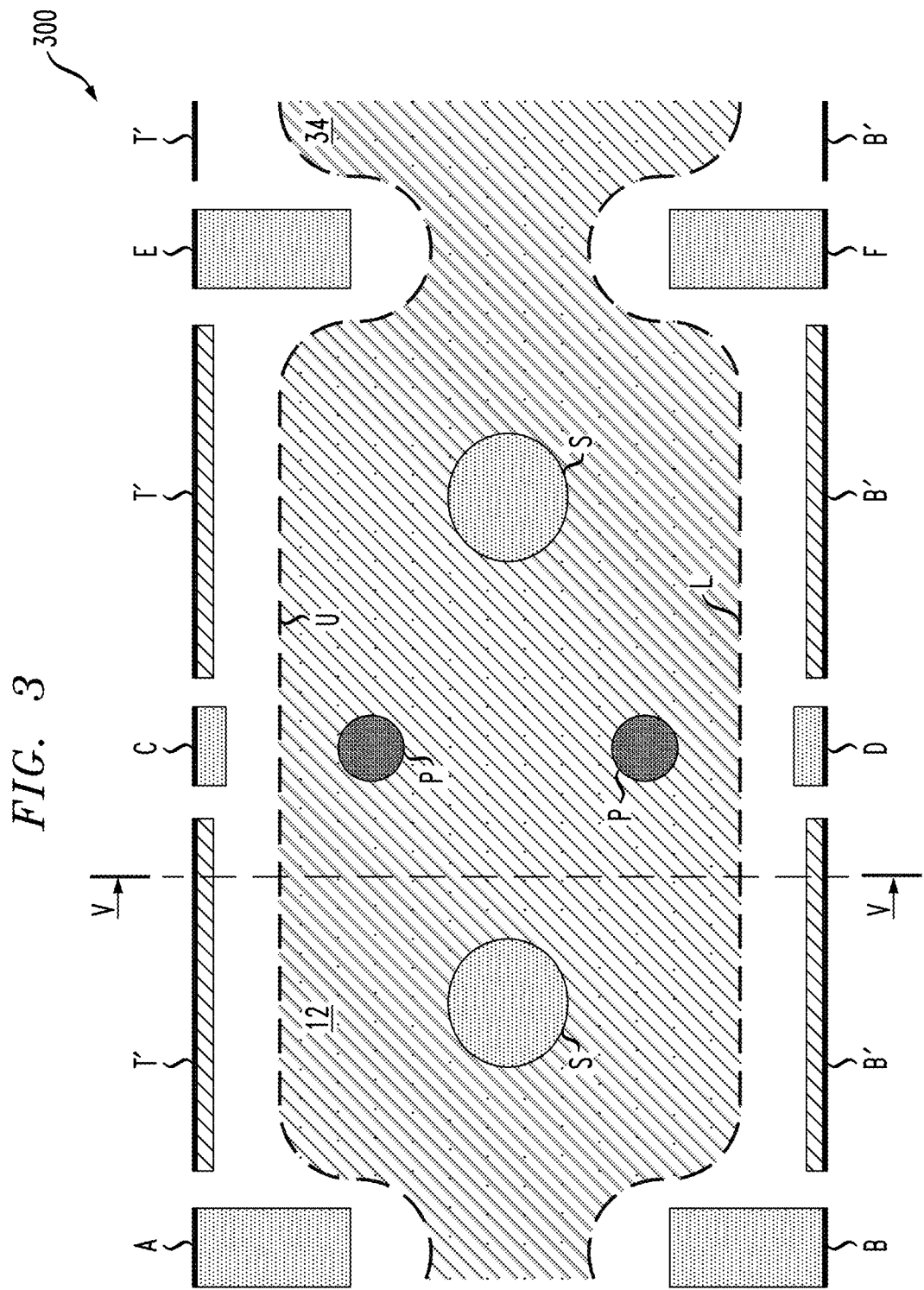
FIG. 3 shows a schematic diagram of a portion of a memory cell that can be used in a quantum-computing device according to yet another embodiment.

FIG. 3 shows a schematic diagram of a portion of a memory cell 300 that can be used in a quantum-computing device according to yet another embodiment. More specifically, the schematic diagram of FIG. 3 graphically represents a simplified top view of memory cell 300 that is analogous to the top view shown in FIG. 2. Various electrodes of memory cell 300 are labeled using the same labeling scheme as in FIGS. 1-2 to better illustrate a functional relationship between the different disclosed memory cells. Two memory cells 300 can be combined to form a memory cell for a single qubit based on the FQHE, e.g., similar to memory cell 200 (FIG. 2).

Memory cell 300 differs from the left half of memory cell 200 (see FIG. 2) in that the electrodes C and D are shorter in memory cell 300. This size change in effect causes the regions 1 and 2 (FIG. 2) to merge into a corresponding region 12 (FIG. 3). Regions 3 and 4 (FIG. 2) similarly merge into a corresponding region 34 (FIG. 3), which is only partially shown in FIG. 3. In an example embodiment, each of the regions 12 and 34 may have a size of approximately $3 \times 5$ μm$^2$.

Memory cell 300 also comprises two small electrodes P, which are approximately aligned with the electrodes C and D. As already indicated above, each of electrodes P is dot-like and may be separately electrically biased. Such separate and independent biasing of electrodes P can be used, e.g., to enable better control of tunneling of charge and/or edge excitations in memory cell 300.

Figure 4:
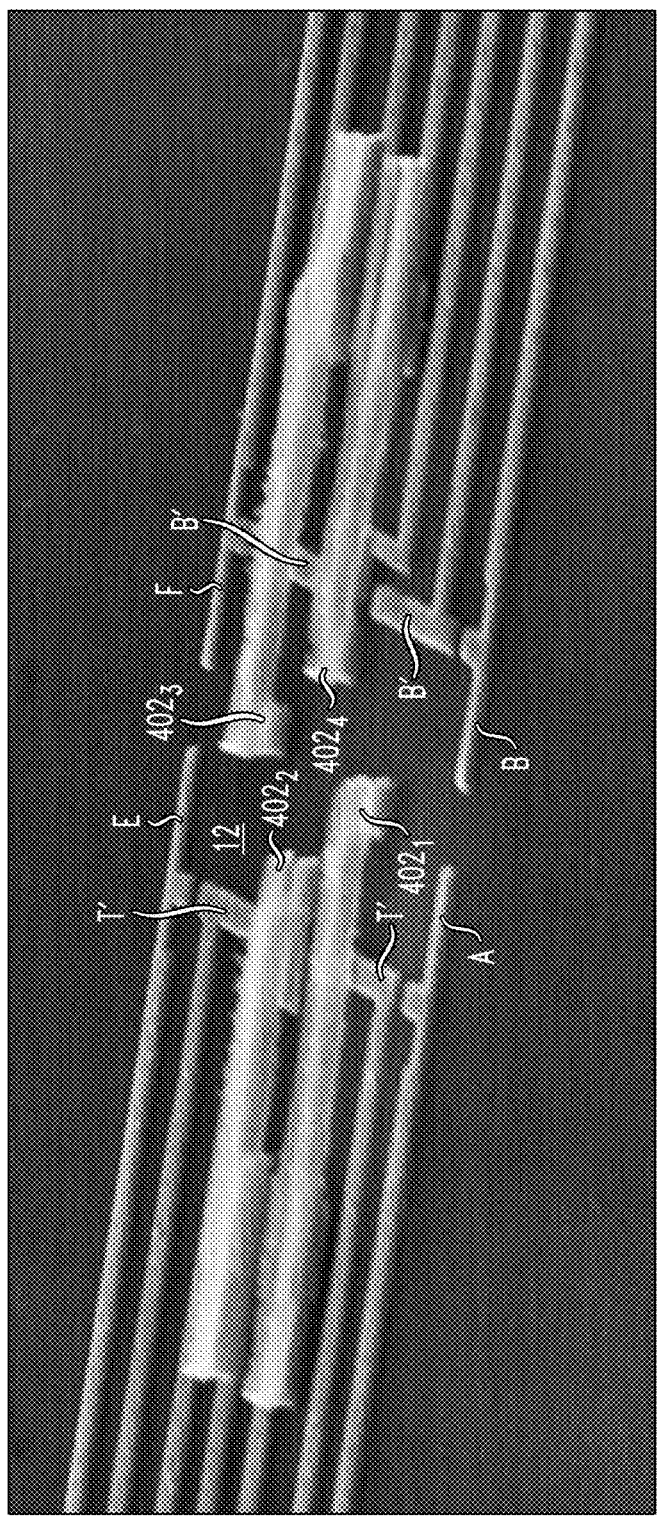
FIG. 4 shows a three-dimensional perspective view of a portion of the memory cell of FIG. 3 according to an embodiment.

FIG. 4 shows a three-dimensional perspective view of a portion of memory cell 300 according to an embodiment. More specifically, an electrical-interconnect structure that provides electrical contacts to various electrodes of memory cell 300 is explicitly shown in FIG. 4. As shown, the electrical-interconnect structure includes electrical overpass bridges $402_1$-$402_4$.

Each of the electrical overpass bridges $402_1$ and $402_3$ provides an electrical contact to the corresponding one of the dot-like electrodes S (also see FIG. 3). More specifically, bridge $402_1$ overhangs the corresponding electrode T' without making electrical contact therewith. Bridge $402_3$ similarly overhangs the corresponding electrode B' without making electrical contact therewith. The end section of bridge $402_2$ located over region 12 has a downward extension, which makes electrical contact with the corresponding one of the dot-like electrodes S. The end section of bridge $402_3$ located over region 12 similarly has a downward extension, which makes electrical contact with the other one of the dot-like electrodes S. Said end sections of the bridges $402_1$ and $402_3$ obscure the view of the dot-like electrodes S in FIG. 4.

Each of the electrical overpass bridges $402_2$ and $402_4$ provides an electrical contact to the corresponding one of the dot-like electrodes P (also see FIG. 3). More specifically, bridge $402_2$ overhangs electrode C without making electrical contact therewith. Bridge $402_4$ similarly overhangs electrode D without making electrical contact therewith. In the perspective view of FIG. 4, bridges $402_2$ and $402_4$ obscure the view of the electrodes C and D, respectively. The location of electrodes C and D in FIG. 4 can be inferred by comparing FIGS. 3 and 4. The end section of bridge $402_2$ located over region 12 has a downward extension, which makes electrical contact with the corresponding one of the dot-like electrodes P. The end section of bridge $402_4$ located over region 12 similarly has a downward extension, which makes electrical contact with the other one of the dot-like electrodes P. Said end sections of the bridges $402_2$ and $402_4$ obscure the view of the dot-like electrodes P in FIG. 4.

Figure 5:
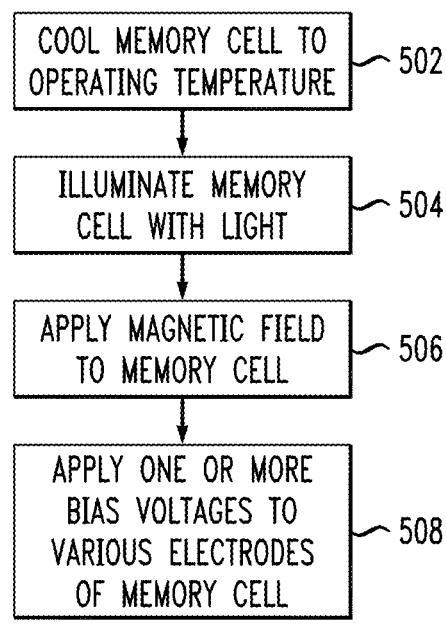
FIG. 5 shows a flowchart of a method that can be used to operate any one of the memory cells of FIGS. 1-4 according to an embodiment.

FIG. 5 shows a flowchart of a method 500 that can be used to operate any one of memory cells 10, 200, and 300 according to an embodiment or to operate a set of laterally neighboring memory cells connected by electrode-controllable channels to form a quantum computing circuit. For illustration purposes and without any implied limitations, method 500 is described below in reference to memory cell 300 (FIGS. 3-4).

At step 502 of method 500, memory cell 300 is cooled to a suitable operating temperature. Such operating temperature may typically be lower than the boiling temperature (=4.2 K) of liquid helium at 15 psi, e.g., below 150 to 200 mK or approximately 100 mK.

At step 504, region 12 of memory cell 300 is illuminated with light, e.g., red light or other (e.g., infrared or other visible) light. In some embodiments, one or more sub-steps of step 504 can be performed concurrently with step 502, i.e., during one or more time intervals when memory cell 300 is being cooled down to the operating temperature.

Illumination of the semiconductor heterostructures corresponding to region 12 may typically improve the electron-electron correlations and thereby strengthen the subsequently formed pertinent correlated states, such as those at filling factors 5/2, 7/2, and 12/5. In an example embodiment, e.g., for GaAs-based heterostructures, step 504 may be carried out using a red light-emitting diode (LED), whose photon energy is ~1.9 eV. For reference, the bandgap of GaAs at 300 mK is 1.42 eV. The LED can be activated over a range of times, e.g., between 1 second and 10 minutes, and the red light can be applied preferably when the temperature of memory cell 300 is lower than 77 K. In alternative embodiments, other suitable wavelengths of light can similarly be used. The illumination duration and the temperature at which the light is applied to region 12 of memory cell 300 may typically depend on the specific implementation details of the corresponding semiconductor heterostructures.

Typically, the above-described illumination may increase the electron density in the 2DCCG gas up to a certain limit, the value of which may depend on the embodiment. The increased electron density may be beneficial in that it may contribute to the strength of the correlated states, as measured by their correlated-state energy gaps. However, the increased strength of the states caused by the illumination may only partially be due to the increased electron density. More specifically, the inventor believes that a weak illumination may cause filling of charged scattering sites with charges (e.g., may neutralize said sites) within and near the main 2D electron channel, thereby reducing the disrupting effect of those sites on the electron correlations.

In an example embodiment, the illumination of step 504 can be applied in multiple consecutive time intervals. Following each of such intervals, the electron density and overall strength of the correlated states can be tested to determine whether or not a maximum empirically derived electron density and the state strength are approached or reached. Step 504 may be terminated when such determination is in the affirmative.

At step 506, a magnetic field is applied to memory cell 300. The magnetic field may be adjusted during step 506 as deemed appropriate or necessary. In an example embodiment, the magnetic-field strength may be about 5 Tesla or more.

At step 508, one or more bias voltages may be applied to the various electrodes of memory cell 300. Such voltages may be suitably selected to write or read the FQHE state(s), change said state(s), and perform computation with said state(s).

In some embodiments, step 508 may be performed before step 506 or both before and after step 506.

In at least some conventional memory cells, detrimental "clumping" of electrons may occur due to the large magnetic field applied to the memory cell at step 506. Such clumping may disadvantageously cause the electron density to become non-uniform within the memory cell, which may perturb, disrupt, or even destroy the correlated states of the 2DCCG gas therein.

This and possibly some other related problems in the state of the art may beneficially be addressed using at least some embodiments disclosed herein. More specifically, according to an example embodiment, a memory cell, e.g., any one of cells 10, 200, and 300, may be outfitted with a thin, metal surface gate that laterally fits into the corresponding region, e.g., any one of regions 1-4, 12 and 34, of the memory cell, without being in direct contact with the electrodes defining the perimeter of the region. The surface gate may have apertures (e.g., holes or openings) to accommodate therein the dot-like electrodes, e.g., S, P, and enable the corresponding electrical overpass bridges, e.g., $402_1$-$402_4$, to be connected to those dot-like electrodes. The thickness of the surface gate may be selected such as to not functionally hinder illuminating step 504 of method 500 and/or not unacceptably degrade the intended results thereof. In at least some embodiments, the electrical-interconnect structure of the memory cell (e.g., see FIG. 4) may be designed to enable separate electrical biasing of the surface gate, e.g., independent of the electrical biasing of some other electrodes of the memory cell. Such electrical interconnect structure may or may not vertically overlap one or more other electrode(s) while being electrically insulated therefrom. Advantageously, such a surface gate may significantly reduce or completely prevent detrimental clumping of electrons in the corresponding memory cell and may further be used to at least partially control the overall density of electrons within the qubit, e.g., through application of an individually controlled, separate electrical bias to the surface gate.

Figure 6:
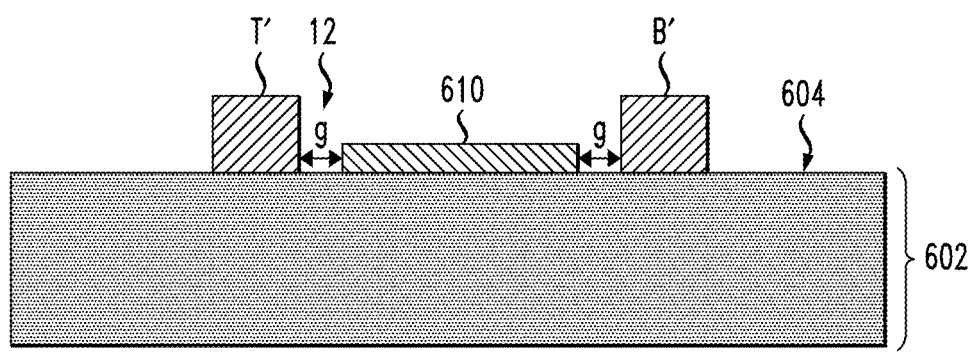
FIG. 6 schematically shows a cross-sectional side view of the memory cell of FIG. 3 according to an embodiment.

FIG. 6 schematically shows a cross-sectional side view of memory cell 300 according to an embodiment. More specifically, the cross-sectional side view shown in FIG. 6 corresponds to the cross-section plane VV shown in FIG. 3. As shown in FIG. 6, memory cell 300 comprises a multi-layered semiconductor substrate 602, which includes the above-mentioned semiconductor heterostructures of the cell. Substrate 602 has an upper planar surface 604, along which the electrodes T' and B' are disposed. Within region 12, which is laterally bounded by the shown electrodes T' and B', surface 604 has a thin, metal surface gate 610 disposed thereon as indicated in FIG. 6. In an example embodiment, the thickness of surface gate 610 may be smaller than the thickness of the electrodes T' and B'. The width g of the gap between surface gate 610 and each of the electrodes T' and B' may typically be selected to be approximately the same as the vertical extent (depth) of the 2DCCG gas with respect to surface 604.

In an example embodiment, surface gate 610 may be made of palladium and have a thickness of approximately 30 nm or less. In alternative embodiments, other suitable metals or metal alloys may similarly be used to make surface gate 610. In general, the thickness of surface gate 610 may be selected such that the optical transmittance of the surface gate at the wavelength used at illumination step 504 of method 500 is at least 10%, but preferably more than approximately 50%. That is surface gate 610 is partially transparent at that wavelength, e.g., partially transparent to red or infrared LED light.

Figure 7:
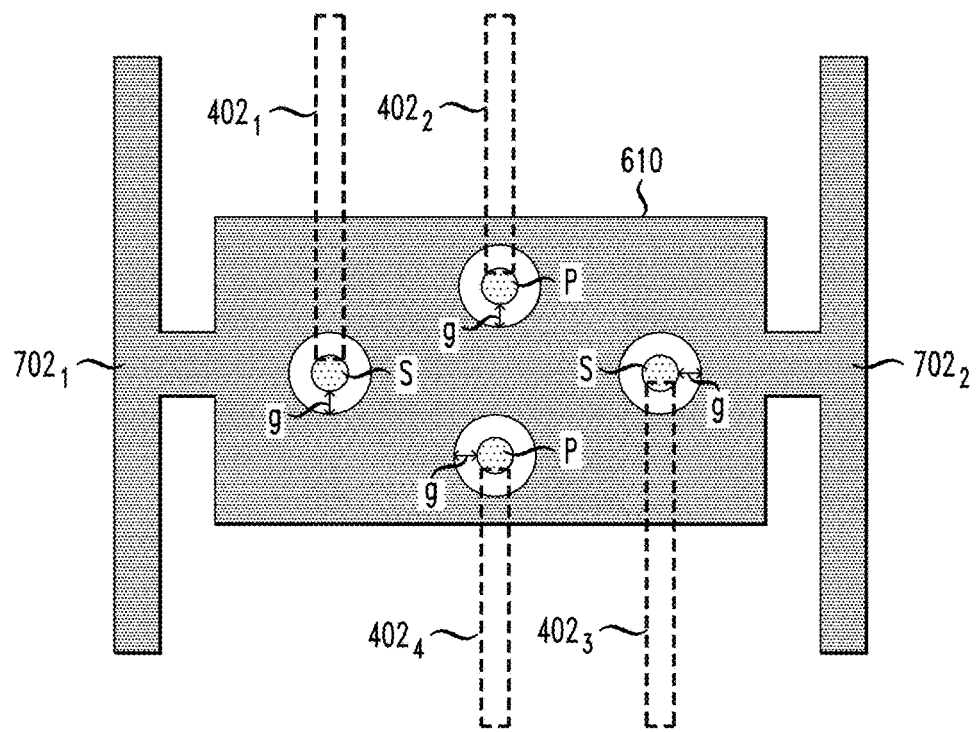
FIG. 7 schematically shows a top view of a surface gate that can be used in the memory cell of FIG. 3 according to an embodiment.

FIG. 7 schematically shows a top view of surface gate 610 according to an embodiment. As shown, surface gate 610 has a generally rectangular shape with four circular openings (or other suitable-shape openings, not explicitly shown in FIG. 7) to accommodate therein the dot-like electrodes S, P without creating direct electrical contacts between the surface gate and dot-like electrodes. The diameters of the openings may be selected such that the gaps between the edges of the dot-like electrodes S, P and the corresponding borders of the openings are approximately the same as the gap width g indicated in FIG. 6.

The dashed-line rectangles in FIG. 7 indicate the positions of electrical overpass bridges $402_1$-$402_4$ to better illustrate the relationship between the views shown in FIGS. 3, 4, and 7. Electrical contacts between surface gate 610 and an external voltage source (not explicitly shown in FIG. 7) can be established by way of T-shaped electrical leads $702_1$ and $702_2$, which are coplanar with the main body of the surface gate. The leg of the "T" of electrical lead $702_1$ is shaped to fit into the channel between the facing channel electrodes A and B (also see FIG. 3). The leg of the "T" of electrical lead $702_2$ is similarly shaped to fit into the channel between the facing channel electrodes E and F (also see FIG. 3).

Figure 8:
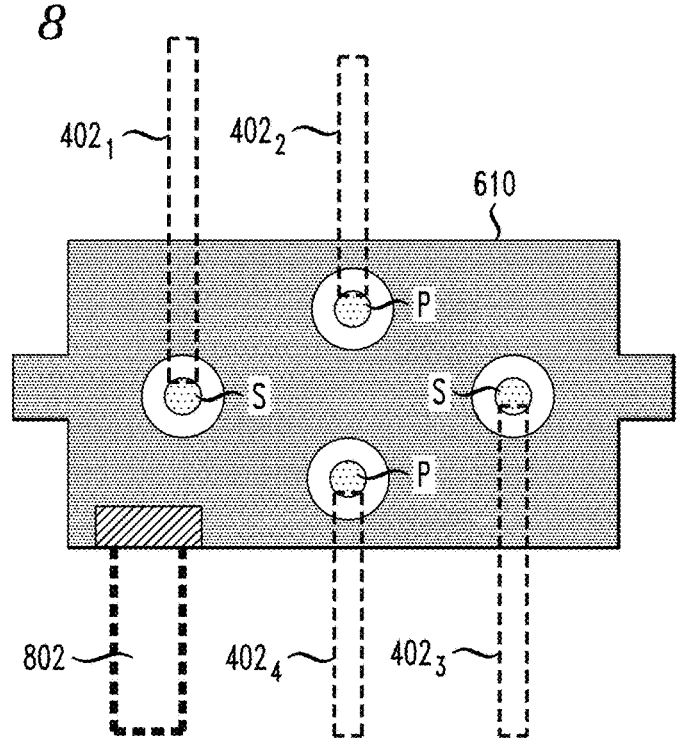
FIG. 8 schematically shows a top view of a surface gate that can be used in the memory cell of FIG. 3 according to another embodiment.

FIG. 8 schematically shows a top view of surface gate 610 according to another embodiment. The embodiment of FIG. 8 differs from the embodiment of FIG. 7 by the manner in which an electrical contact to surface gate 610 is provided. More specifically, in the embodiment of FIG. 8, an additional electrical overpass bridge, labeled 802, is used to electrically connect surface gate 610 to an external voltage source. In an example embodiment, electrical overpass bridge 802 may be structurally similar to one of electrical overpass bridges $402_1$-$402_4$ (see FIG. 4). The overpass bridge 802 may vertically overlap one or more other electrodes of the memory cell, e.g., electrodes A-J, T', B' of FIGS. 1-3, but is typically not in physical contact with said one or more other electrodes.

Figure 9:
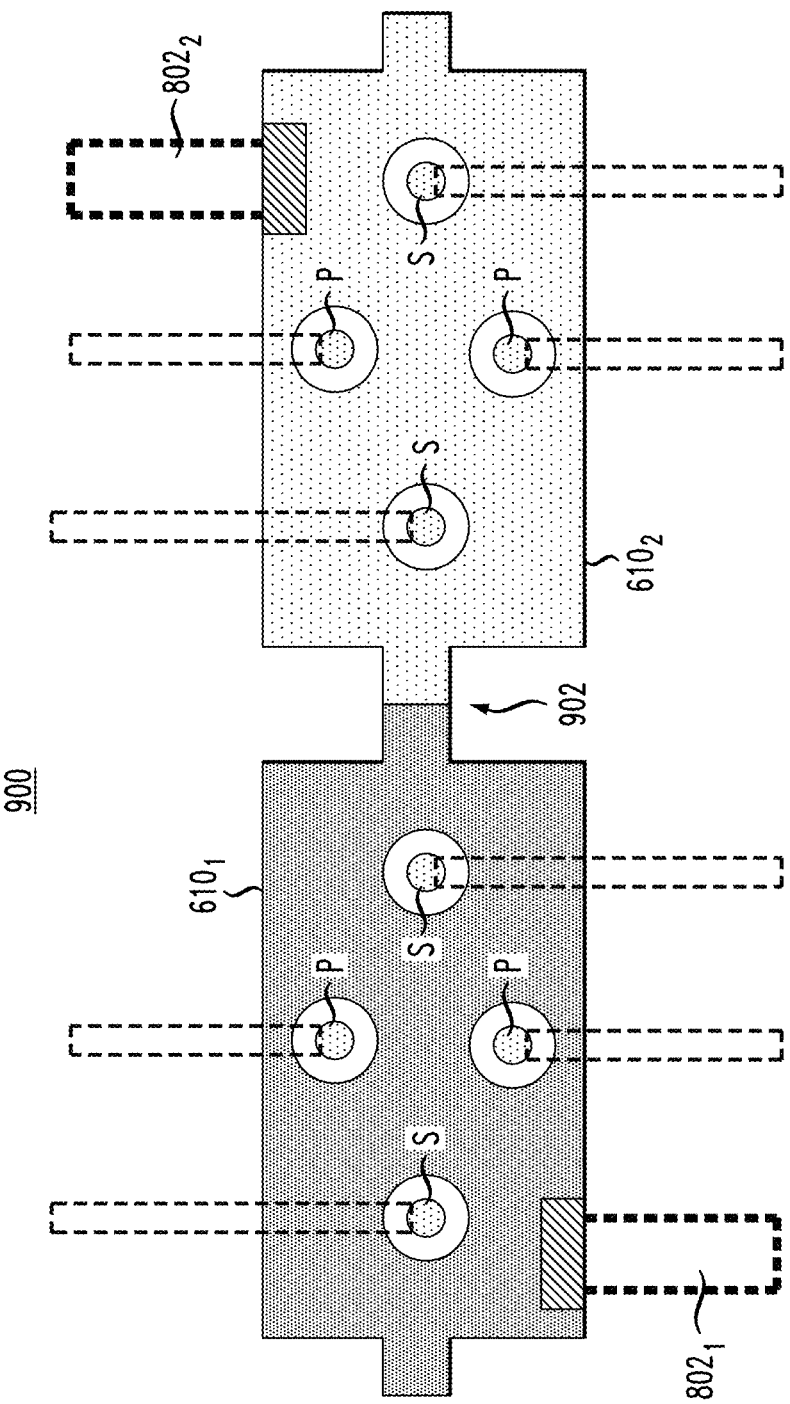
FIG. 9 schematically shows a top view of an arrangement comprising two surface gates according to an embodiment.

FIG. 9 schematically shows a top view of an arrangement 900 comprising two surface gates 610 (labeled $610_1$ and $610_2$, respectively) according to an embodiment. Arrangement 900 is suitable for a single-qubit memory cell comprising two memory cells 300, wherein surface gate $610_1$ is located in region 12, and surface gate $610_2$ is located in region 34 (also see FIG. 3). A small gap 902 between facing end portions of surface gates $610_1$ and $610_2$ enables the two surface gates to be separately and independently biased using respective electrical overpass bridges 802, which are labeled $802_1$ and $802_2$, respectively.

From the provided description, a person of ordinary skill in the pertinent art will readily understand that differently shaped, thin, metal surface gates, e.g., analogous to a surface gate 610, may be incorporated into differently shaped and configured memory cells for storing, manipulating, and reading qubits.

According to an example embodiment disclosed above, e.g., in the summary section and/or in reference to any one or any combination of some or all of FIGS. 1-9, provided is an apparatus comprising: a semiconductor substrate (e.g., 602, FIG. 6) having a quantum-well structure along a surface (e.g., 604, FIG. 6) thereof; one or more memory cells (e.g., 300, FIG. 3) on the substrate, each of the memory cells having a pattern of controllable electrodes on the surface of the substrate, the electrodes laterally defining a physical sequence of two or more lateral regions (e.g., 1-4, FIG. 2; 12, 34, FIG. 3) of the quantum-well structure joined by one or more channels; and one or more metal surface gates (e.g., 610, FIGS. 6-9) on the surface of the substrate within the two or more lateral regions, the one or more metal surface gates having a thickness that enables a substantial portion of light impinging thereupon to penetrate therethrough to the surface of the substrate; and wherein the electrodes are controllable to deplete lateral areas of the quantum-well structure of charge carriers such that a droplet of the charge carriers in the quantum-well structure is localized laterally along the surface of the substrate beneath the one or more metal surface gates.

In some embodiments of the above apparatus, the thickness is selected to cause at least 10% of the light to penetrate to the surface of the substrate.

In some embodiments of any of the above apparatus, the thickness is selected to cause at least 50% of the light to penetrate to the surface of the substrate.

In some embodiments of any of the above apparatus, the one or more metal surface gates comprise a metal film deposited on the surface.

In some embodiments of any of the above apparatus, the metal film is partially transparent to red light. Herein, the term "partially transparent" should be interpreted as representing the optical transmittance of 10% or more.

In some embodiments of any of the above apparatus, the metal film comprises palladium.

In some embodiments of any of the above apparatus, the metal film is partially transparent to light having a photon energy larger than a bandgap of the quantum-well structure.

In some embodiments of any of the above apparatus, the apparatus further comprises a plurality of dot-like electrodes (e.g., S, FIGS. 1-3; P, FIG. 3) on the surface of the substrate within the two or more lateral regions; and wherein the metal film has a plurality of circular openings, each of the circular openings having therein a respective one of the dot-like electrodes.

In some embodiments of any of the above apparatus, a circular opening of the plurality and the respective dot-like electrode are not in direct electrical contact with each other.

In some embodiments of any of the above apparatus, the apparatus further comprises a metal interconnect structure (e.g., shown in FIG. 4) enabling at least one of the one or more metal surface gates to receive a separate electrical bias (e.g., different than the electrical bias received by at least some of the controllable electrodes).

In some embodiments of any of the above apparatus, the one or more metal surface gates include first and second metal surface gates (e.g., $610_1$, $610_2$, FIG. 9), which are not in direct electrical contact with each other (e.g., separated by 902, FIG. 9).

In some embodiments of any of the above apparatus, the apparatus further comprises a metal interconnect structure (e.g., including $802_1$, $802_2$, FIG. 9) enabling the first and second metal surface gates to receive different respective electrical biases.

In some embodiments of any of the above apparatus, the electrodes are controllable to perform one or more of the following: store a multi-qubit state on the droplet, while the droplet is maintained in a fractional-quantum-Hall-effect state; read one or more qubit values stored in the one or more memory cells; and do an entanglement computation with said multi-qubit state stored on the droplet.

In some embodiments of any of the above apparatus, the electrodes are controllable to perform two or more of the following: store a multi-qubit state on the droplet, while the droplet is maintained in a fractional-quantum-Hall-effect state; read one or more qubit values stored in the one or more memory cells; and do an entanglement computation with said multi-qubit state stored on the droplet.

In some embodiments of any of the above apparatus, the electrodes are controllable to perform the following: store a multi-qubit state on the droplet, while the droplet is maintained in a fractional-quantum-Hall-effect state; read one or more qubit values stored in the one or more memory cells; and do an entanglement computation with said multi-qubit state stored on the droplet.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless otherwise specified herein, in addition to its plain meaning, the conjunction "if" may also or alternatively be construed to mean "when" or "upon" or "in response to determining" or "in response to detecting," which construal may depend on the corresponding specific context. For example, the phrase "if it is determined" or "if [a stated condition] is detected" may be construed to mean "upon determining" or "in response to determining" or "upon detecting [the stated condition or event]" or "in response to detecting [the stated condition or event]."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the electrodes are horizontal but would be horizontal where the electrodes are vertical, and so on.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

"SUMMARY OF SOME SPECIFIC EMBODIMENTS" in this specification is intended to introduce some example embodiments, with additional embodiments being described in "DETAILED DESCRIPTION" and/or in reference to one or more drawings. "SUMMARY OF SOME SPECIFIC EMBODIMENTS" is not intended to identify essential elements or features of the claimed subject matter, nor is it intended to limit the scope of the claimed subject matter.

What is claimed is:

1. An apparatus, comprising:
   a semiconductor substrate having a quantum-well structure corresponding to one or more memory cells, each of the memory cells having a pattern of controllable electrodes, the electrodes laterally defining a physical sequence of two or more lateral regions of the quantum-well structure joined by one or more channels; and
   one or more metal surface gates on the surface of the substrate substantially covering the two or more lateral regions, the one or more metal surface gates having a thickness that enables a substantial portion of light impinging thereupon to penetrate therethrough to the surface of the substrate; and
   wherein the electrodes are controllable to deplete lateral areas of the quantum-well structure of charge carriers such that a 2-dimensional droplet of the charge carriers in the quantum-well structure is localized laterally along the substrate beneath the one or more metal surface gates;
   wherein the one or more metal surface gates have one or more openings, each of the one or more openings having therein a respective dot-like electrode of the pattern of controllable electrodes; and
   wherein each of the one or more dot-like electrodes is not in direct electrical contact with any of the one or more metal surface gates; and
   wherein each of the one or more dot-like electrodes is in direct electrical contact with a corresponding electrical overpass bridge.

2. The apparatus of claim 1, wherein the thickness is selected to cause at least 10% of the light to penetrate to the surface of the substrate.

3. The apparatus of claim 1, wherein the thickness is selected to cause at least 50% of the light to penetrate to the surface of the substrate.

4. The apparatus of claim 1, wherein the one or more metal surface gates comprise a metal film deposited on the surface.

5. The apparatus of claim 4, wherein the metal film is partially transparent to red light.

6. The apparatus of claim 4, wherein the metal film comprises palladium.

7. The apparatus of claim 4, wherein the metal film is partially transparent to light having a photon energy larger than a bandgap of the quantum-well structure.

8. The apparatus of claim 1, further comprising a metal interconnect structure enabling at least one of the one or more metal surface gates to receive a separate electrical bias.

9. The apparatus of claim 1, wherein the one or more metal surface gates include first and second metal surface gates, which are not in direct electrical contact with each other.

10. The apparatus of claim 9, further comprising a metal interconnect structure enabling the first and second metal surface gates to receive different respective electrical biases.

11. The apparatus of claim 1, wherein the electrodes are controllable to perform one or more of the following:
   store a multi-qubit state on the droplet, while the droplet is maintained in a fractional-quantum-Hall-effect state;
   read one or more qubit values stored in the one or more memory cells; and
   do an entanglement computation with said multi-qubit state stored on the droplet.

12. The apparatus of claim 1, wherein the electrodes are controllable to perform two or more of the following:
   store a multi-qubit state on the droplet, while the droplet is maintained in a fractional-quantum-Hall-effect state;
   read one or more qubit values stored in the one or more memory cells; and
   do an entanglement computation with said multi-qubit state stored on the droplet.

13. The apparatus of claim 1, wherein the electrodes are controllable to perform the following:
   store a multi-qubit state on the droplet, while the droplet is maintained in a fractional-quantum-Hall-effect state;
   read one or more qubit values stored in the one or more memory cells; and
   do an entanglement computation with said multi-qubit state stored on the droplet.

14. The apparatus of claim 1, wherein:
   the electrodes laterally define the physical sequence of at least first and second lateral regions of the quantum-well structure; and
   the apparatus comprises at least first and second metal surface gates substantially covering the at least first and second lateral regions, respectively.

15. The apparatus of claim 14, wherein the first and second metal surface gates are electrically separated by a gap.

* * * * *